United States Patent
Korb et al.

(10) Patent No.: US 9,432,052 B2
(45) Date of Patent: Aug. 30, 2016

(54) PUNCTURE-AWARE LOW DENSITY PARITY CHECK (LDPC) DECODING

(71) Applicant: BROADCOM CORPORATION, Irvine, CA (US)

(72) Inventors: Matthias Korb, Mission Viejo, CA (US); Andrew John Blanksby, Lake Oswego, OR (US)

(73) Assignee: Broadcom Corporation, Irvine, CA (US)

( * ) Notice: Subject to any disclaimer, the term of this patent is extended or adjusted under 35 U.S.C. 154(b) by 149 days.

(21) Appl. No.: 14/501,719

(22) Filed: Sep. 30, 2014

(65) Prior Publication Data

US 2016/0087648 A1    Mar. 24, 2016

Related U.S. Application Data

(60) Provisional application No. 62/052,218, filed on Sep. 18, 2014.

(51) Int. Cl.
*H03M 13/11* (2006.01)
*H03M 13/00* (2006.01)
(Continued)

(52) U.S. Cl.
CPC ....... *H03M 13/1105* (2013.01); *H03M 13/005* (2013.01); *H03M 13/116* (2013.01);
(Continued)

(58) Field of Classification Search
CPC ......... H03M 13/1105; H03M 13/005; H03M 13/116; H03M 13/1185; H03M 13/6362; H03M 13/1188; H03M 13/118; H03M 13/618; H03M 13/1174; H03M 13/616; H03M 13/6393; H03M 13/1117; H03M 13/1165; H03M 13/255; H03M 13/2927

USPC ................ 714/752, 790, 751, 800, 776, 786
See application file for complete search history.

(56) References Cited

U.S. PATENT DOCUMENTS 7,395,494 B2 *  7/2008  Lee .................... H03M 13/1137
                                                                714/801
8,196,012 B2 *  6/2012  Lau ...................... H03M 13/116
                                                                714/758

(Continued)

OTHER PUBLICATIONS

Liu et al., Rate-Compatible LDPC Codes Based on Puncturing and Extension Techniques for Short Block Lengths, Jul. 19, 2014, IEEE, pp. 1-9.*

(Continued)

*Primary Examiner* — John J Tabone, Jr.

(74) *Attorney, Agent, or Firm* — Garlick & Markison; Shayne X. Short

(57) ABSTRACT

A communication device or device includes a processor that generates and interprets signals that are transmitted and received via a communication interface. The processor receives an LDPC coded signal, via the communication interface, that is generated by puncturing at least one parity bit from another LDPC coded signal that is generated based on an LDPC code characterized by a first LDPC matrix. The processor operates on the first LDPC matrix to generate a second LDPC matrix by excluding at least one column and at least one row from the first LDPC matrix. The number of columns and rows excluded from the first LDPC matrix is based on the number of bits punctured from the other LDPC coded signal to generate the LDPC coded signal. The processor then decodes the LDPC coded signal using the second LDPC matrix to make estimates of information bits encoded within the LDPC coded signal.

20 Claims, 6 Drawing Sheets

(51) Int. Cl.
  *H03M 13/29* (2006.01)
  *H03M 13/25* (2006.01)

(52) U.S. Cl.
  CPC ....... *H03M13/118* (2013.01); *H03M 13/1117* (2013.01); *H03M 13/1165* (2013.01); *H03M 13/1174* (2013.01); *H03M 13/1185* (2013.01); *H03M 13/1188* (2013.01); *H03M 13/255* (2013.01); *H03M 13/2927* (2013.01); *H03M 13/616* (2013.01); *H03M 13/618* (2013.01); *H03M 13/6362* (2013.01); *H03M 13/6393* (2013.01)

(56) References Cited

U.S. PATENT DOCUMENTS

| | | | | |
|---|---|---|---|---|
| 8,433,984 B2 * | 4/2013 | Khandekar | ....... | H03M 13/6516 714/751 |
| 8,464,123 B2 * | 6/2013 | Alrod | ......... | G06F 11/1068 714/746 |
| 8,631,299 B2 * | 1/2014 | Sugihara | ............ | H03M 13/1102 714/751 |
| 9,178,653 B2 * | 11/2015 | Shen | ............ | H04L 1/0041 |
| 2008/0059862 A1 * | 3/2008 | Kyung | ............ | H03M 13/11 714/752 |
| 2010/0107033 A1 * | 4/2010 | Kuri | ............ | H03M 13/1102 714/752 |
| 2012/0060071 A1 * | 3/2012 | Shin | ............ | H03M 13/2927 714/755 |
| 2012/0179948 A1 * | 7/2012 | Myung | ............ | H03M 13/1165 714/752 |
| 2014/0201592 A1 * | 7/2014 | Shen | ............ | H04L 1/0041 714/758 |
| 2014/0337682 A1 * | 11/2014 | Prodan | ............ | H03M 13/116 714/755 |
| 2014/0365844 A1 * | 12/2014 | Kliger | ............ | H03M 13/116 714/758 |
| 2015/0263762 A1 * | 9/2015 | Shen | ............ | H03M 13/1111 701/3 |

OTHER PUBLICATIONS

Khattak et al., Jointly optimized rate-compatible UEP-LDPC codes for half-duplex co-operative relay networks, Feb. 2, EURASIP Journal onWireless Communications and Networking 20142014, pp. 1-16.*

* cited by examiner

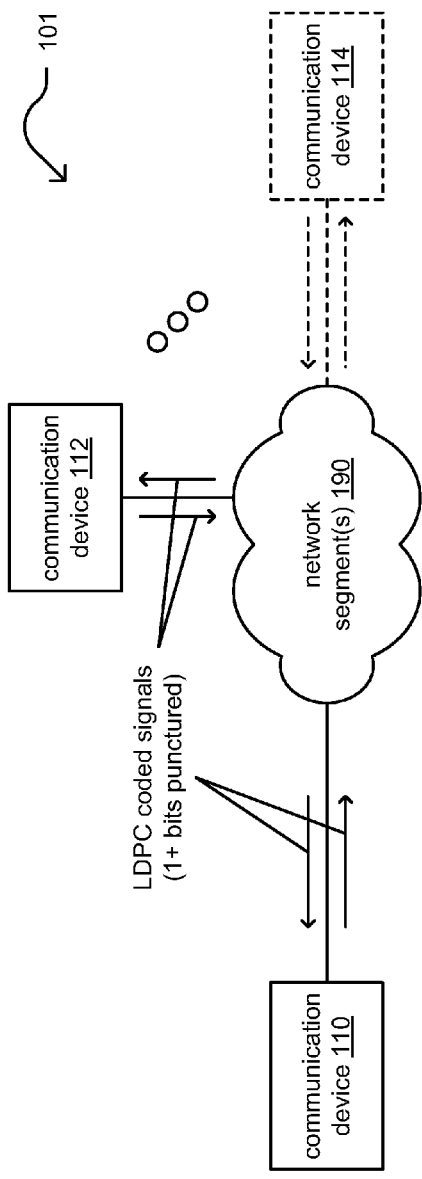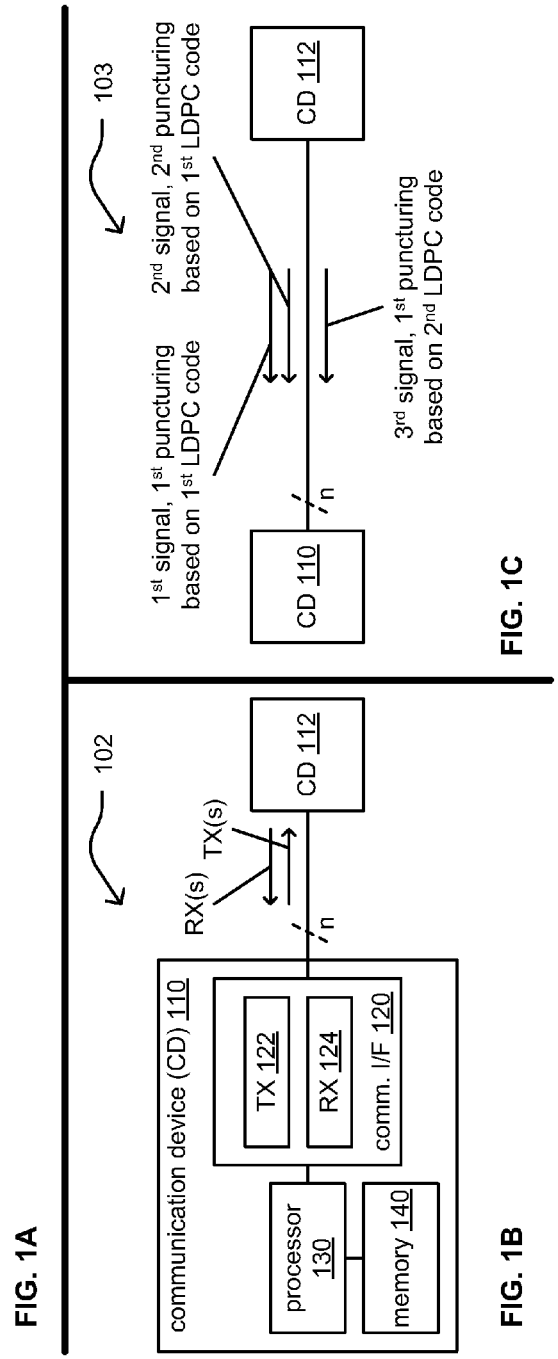

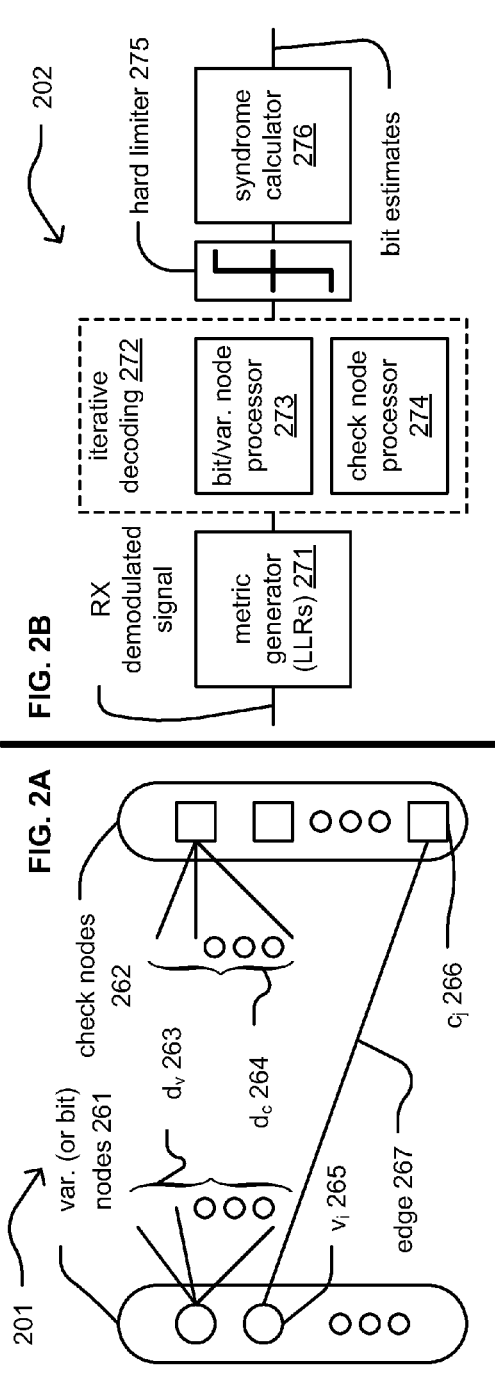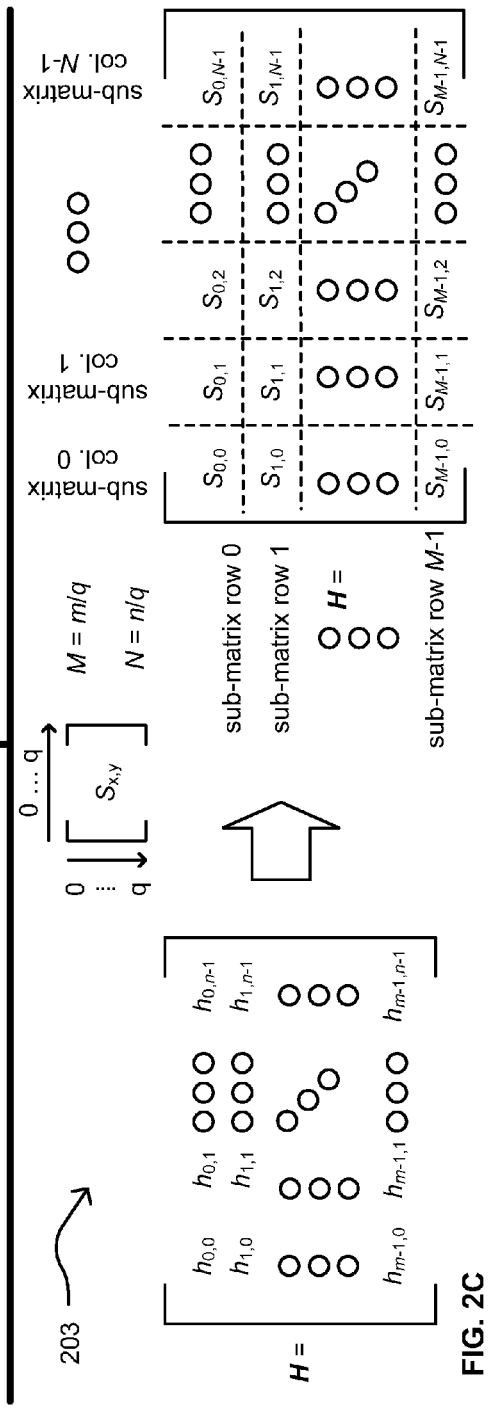

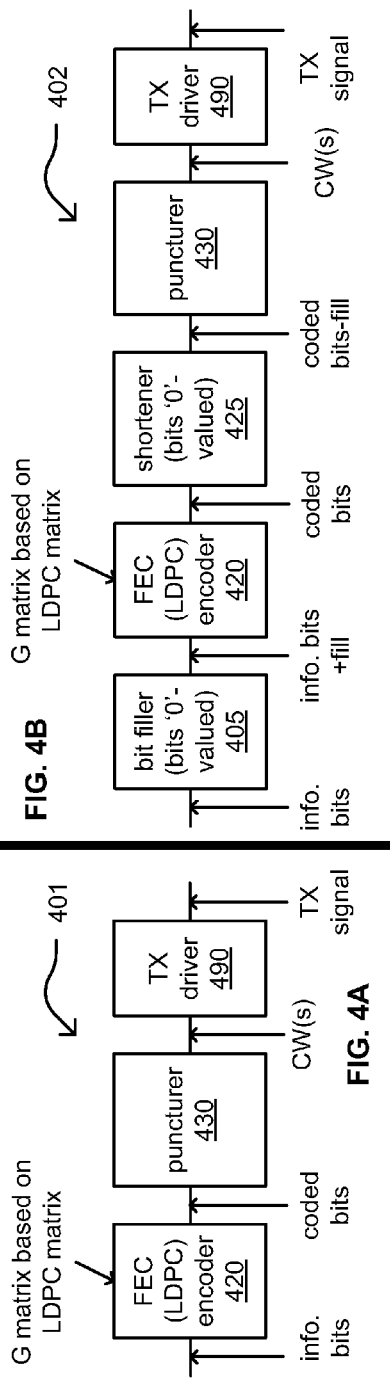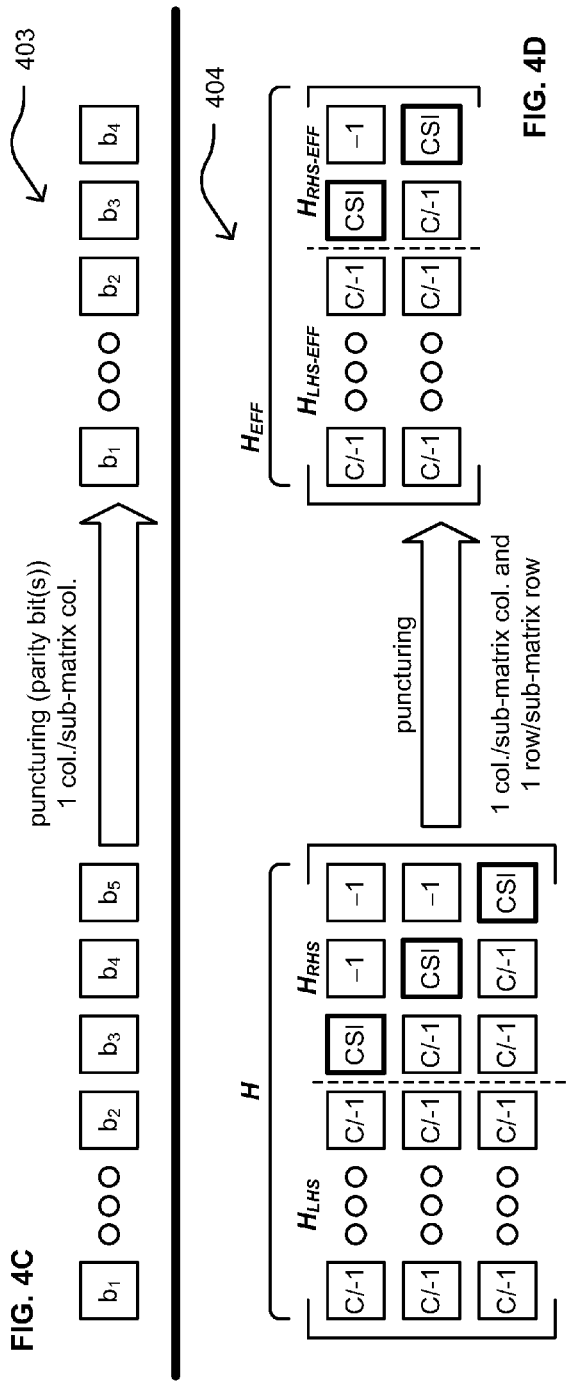

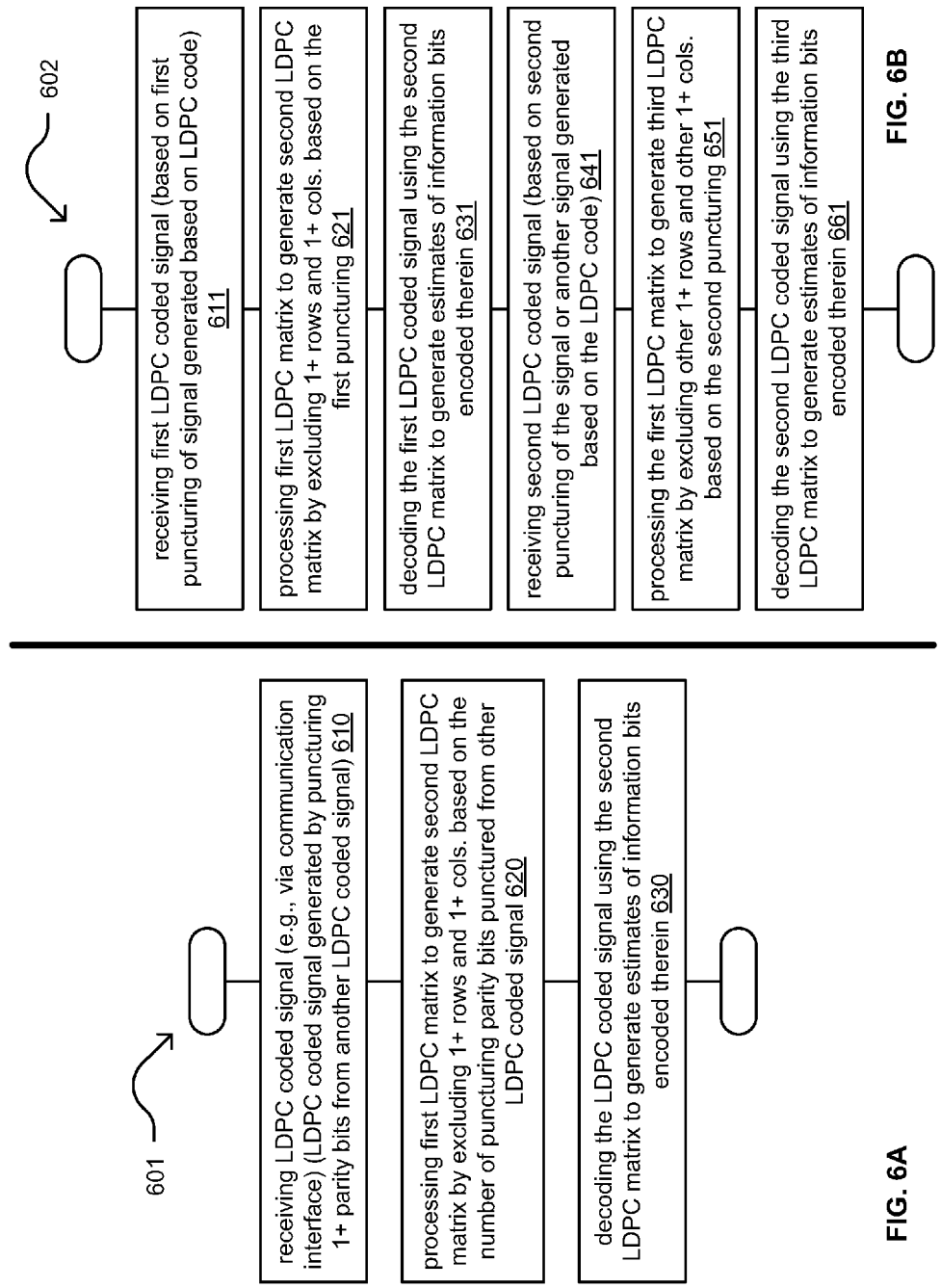

PUNCTURE-AWARE LOW DENSITY PARITY CHECK (LDPC) DECODING

CROSS REFERENCE TO RELATED PATENTS/PATENT APPLICATIONS

Provisional Priority Claim

The present U.S. Utility patent application claims priority pursuant to 35 U.S.C. §119(e) to U.S. Provisional Application No. 62/052,218, entitled "Puncture-aware low density parity check (LDPC) decoding," filed Sep. 18, 2014, which is hereby incorporated herein by reference in its entirety and made part of the present U.S. Utility patent application for all purposes.

BACKGROUND

1. Technical Field

The present disclosure relates generally to communication systems; and, more particularly, to forward error correction (FEC) and/or ECC long encoding and/or decoding within such communication systems.

2. Description of Related Art

Data communication systems have been under continual development for many years. The primary goal within such communication systems is to transmit information successfully between devices. Unfortunately, many things can deleteriously affect signals transmitted within such systems resulting in degradation of or even complete failure of communication. Examples of adverse effects include interference and noise that may be caused by various sources including other communications, low-quality links, degraded or corrupted interfaces and connectors, etc.

Some communication systems use forward error correction (FEC) coding and/or error correction code (ECC) coding to increase the amount of information that may be transmitted between devices. When a signal incurs one or more errors during transmission, a receiver device can employ the FEC or ECC coding to try to correct those one or more errors.

A continual and primary directive in this area of development has been to try continually to lower the signal to noise ratio (SNR) required to achieve a given bit error ratio (BER) or symbol error ratio (SER) within a communication system. The Shannon limit is the theoretical bound for channel capacity for a given modulation and code rate. The ideal goal has been to try to reach Shannon's channel capacity limit in a communication channel. Shannon's limit may be viewed as being the data rate per unit of bandwidth (i.e., spectral efficiency) to be used in a communication channel, having a particular SNR, where transmission through the communication channel with arbitrarily low BER or SER is achievable.

However, in some instances, the SNR of a given channel may be as low as possible and unfortunately incur a BER or SER that does require the error correcting capability of the devices to perform successful communication of information between devices. In some applications, multiple decoding iterations (e.g., when using an iterative decoding approach) are needed. A great deal of effort has been directed to improve the performance of devices that operate using FEC coding and/or ECC, yet much room for improvement still exists including improving the performance of decoding operations within such devices.

BRIEF DESCRIPTION OF THE SEVERAL VIEWS OF THE DRAWINGS

FIG. 1A is a diagram illustrating an embodiment of one or more communication systems.

FIG. 1B is a diagram illustrating a communication device operative within one or more communication systems.

FIG. 1C is a diagram illustrating an example of operation of a communication device within one or more communication systems.

FIG. 2A illustrates an example of an LDPC (Low Density Parity Check) code bipartite graph.

FIG. 2B illustrates an example of decoding of an LDPC coded signal.

FIG. 2C illustrates an example of an LDPC matrix that is partitioned into sub-matrices.

FIG. 4A is a diagram illustrating an example of a communication device configured to perform LDPC encoding and puncturing.

FIG. 4B is a diagram illustrating an example of a communication device configured to perform bit filling, LDPC encoding, shortening, and puncturing.

FIG. 4C is a diagram illustrating an example of puncturing of parity bits from an LDPC codeword.

FIG. 4D is a diagram illustrating an example of processing an LDPC matrix to generate an effective LDPC matrix based on puncturing.

FIG. 6A is a diagram illustrating an embodiment of a method for execution by one or more communication devices.

FIG. 6B is a diagram illustrating another embodiment of a method for execution by one or more communication devices.

DETAILED DESCRIPTION

Figures 3A, 3B:
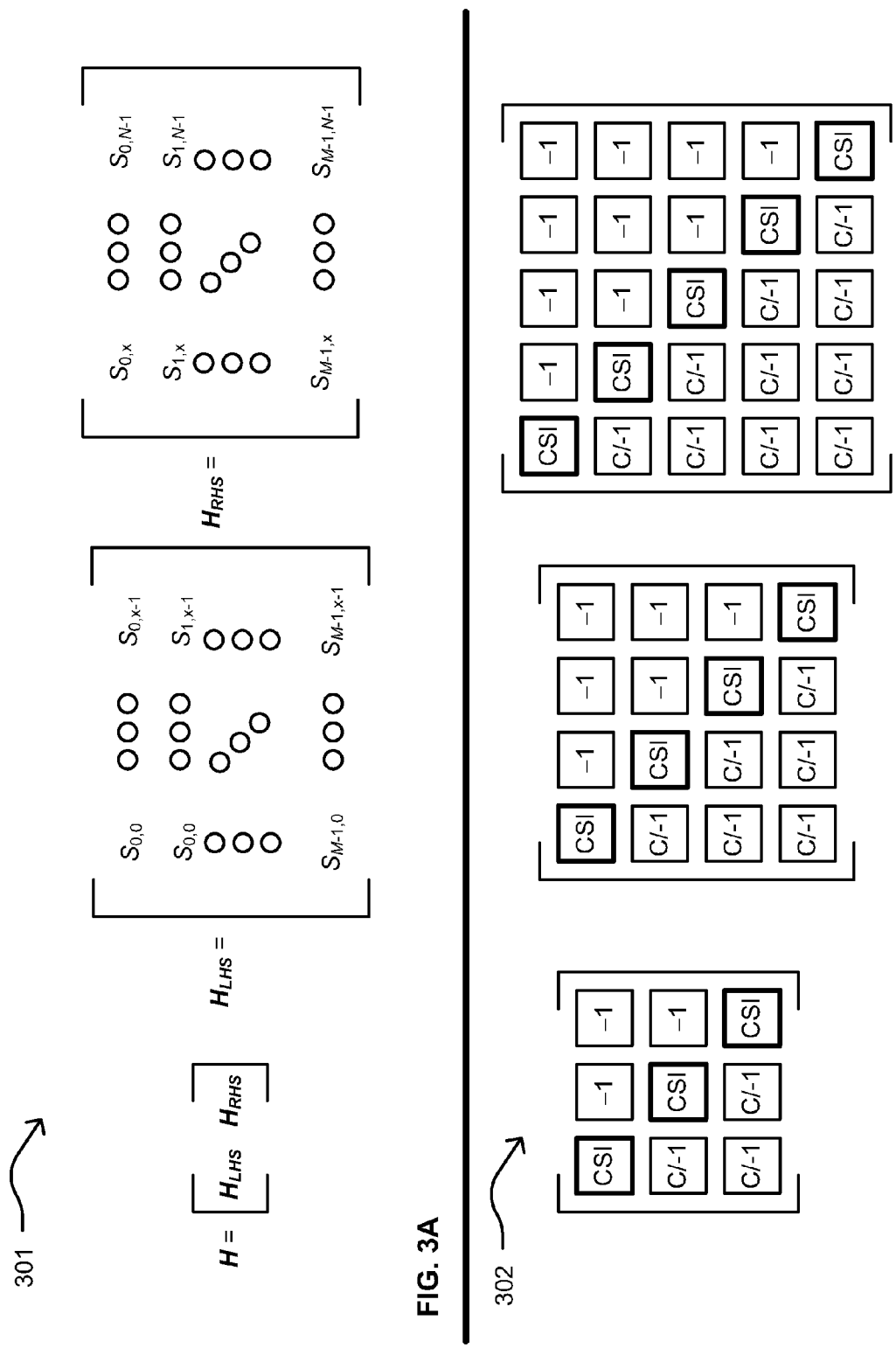
FIG. 3A is a diagram illustrating an example of an LDPC matrix partitioned into a left hand side matrix and a right hand side matrix.
FIG. 3B is a diagram illustrating examples of right hand side matrices of LDPC matrices.

FIG. 1A is a diagram illustrating an embodiment 101 of one or more communication systems. One or more network segments 190 provide communication inter-connectivity for at least two communication devices 110 and 112 (also referred to as CDs in certain locations in the diagrams). Note that general reference to a communication device may be made generally herein using the term 'device' (e.g., device 110 or CD 110 when referring to communication device 110, or devices 110 and 112, or CDs 110 and 112, when referring to communication devices 110 and 112). Generally speaking, any desired number of communication devices are included within one or more communication systems (e.g., as shown by communication device 114).

The various communication links within the one or more network segments 190 may be implemented using any of a variety of communication media including communication links implemented as wireless, wired, optical, satellite, microwave, and/or any combination thereof, etc. communication links. Also, in some instances, communication links of different types may cooperatively form a connection pathway between any two communication devices. Considering one possible example, a communication pathway between devices 110 and 112 may include some segments of wired communication links and other segments of optical communication links. Note also that the devices 110-114 may be of a variety of types of devices including stationary devices, mobile devices, portable devices, etc. and may support communications for any of a number of services or service flows including data, telephony, television, Internet, media, synchronization, etc.

In an example of operation, device 110 includes a communication interface to support communications with one or more of the other devices 112-114. This communication may be bidirectional/to and from the one or more of the other devices 112-114 or unidirectional (or primarily unidirectional) from the one or more of the other devices 112-114.

In an example, device 110 includes a communication interface and a processor. The processor and communication interface operate to receive a low density parity check (LDPC) coded signal (e.g., that is transmitted from another device, such as device 112 and/or 114). The LDPC coded signal is generated from another LDPC coded signal that has had at least one parity bit punctured there from. The at least one parity bit punctured from the other LDPC coded signal may include as few as one parity bit, a contiguous set of parity bits, a non-contiguous set of parity bits, etc. The other LDPC coded signal is generated based on an LDPC code that is characterized by a first LDPC matrix. The processor processes the first LDPC matrix to generate a second LDPC matrix by excluding at least one column and at least one row from the first LDPC matrix based on a number of bits of the at least one parity bit punctured from the other LDPC coded signal to generate the LDPC coded signal. For example, the first LDPC matrix is modified based on the puncturing of one or more parity bits. Corresponding columns are excluded from the first LDPC matrix based on which one or more parity bits have been punctured from the other LDPC coded signal. Note that the number of columns excluded may be as few as one column, a contiguous set of columns, a non-contiguous set of columns, etc. depending on the puncturing of one or more parity bits that has been performed on the other LDPC coded signal. Also, a corresponding number of rows are also excluded from the first LDPC matrix based on the puncturing of the one or more parity bits. For example, a same number of rows and columns may be excluded from the first LDPC matrix. The processor then operates by decoding the LDPC coded signal using the second LDPC matrix to make a plurality of estimates of a plurality of information bits encoded within the LDPC coded signal.

The processor modifies the first LDPC matrix to generate the second LDPC matrix based on the puncturing that was performed on the other LDPC coded signal to generate the LDPC coded signal that is received by the device 110. Such operations obviate any need to reinsert any punctured parity bits to reconstitute the other LDPC coded signal to undergo decoding using the first LDPC matrix. The processor intelligently generates a modified or effective LDPC matrix, namely, the second validity matrix, based on the first LDPC matrix, for use in decoding the LDPC coded signal.

FIG. 1B is a diagram 102 illustrating a communication device (CD) 110 operative within one or more communication systems. The device 110 includes a communication interface 120 and a processor 130. The communication interface 120 includes functionality of a transmitter 122 and a receiver 124 to support communications with one or more other devices within a communication system. The device 110 may also include memory 140 to store information including one or more signals generated by the device 110 or such information received from other devices (e.g., device 112) via one or more communication channels. Memory 140 may also include and store various operational instructions for use by the processor 130 in regards to the processing of messages and/or other received signals and generation of other messages and/or other signals including those described herein. Memory 140 may also store information including one or more types of encoding, one or more types of symbol mapping, concatenation of various modulation coding schemes, etc. as may be generated by the device 110 or such information received from other devices via one or more communication channels. The communication interface 120 supports communications to and from one or more other devices (e.g., CD 112 and/or other communication devices). Operation of the communication interface 120 may be directed by the processor 130 such that processor 130 transmits and receives signals (TX(s) and RX(s)) via the communication interface 120.

In an example, processor 130 receives, via the communication interface 120, an LDPC coded signal (e.g., that is transmitted from another device, such as device 112). The LDPC coded signal is generated from another LDPC coded signal that has had at least one parity bit punctured there from. The processor 130 processes a first LDPC matrix to generate a second LDPC matrix by excluding at least one column and at least one row from the first LDPC matrix based on a number of bits of the at least one parity bit punctured from the other LDPC coded signal to generate the LDPC coded signal. The processor 130 then operates by decoding the LDPC coded signal using the second LDPC matrix to make a plurality of estimates of a plurality of information bits encoded within the LDPC coded signal.

In some examples, the processor 130 operates by excluding a corresponding number of rows from the first LDPC matrix based on the puncturing of the one or more parity bits such that a same number of rows and columns may be excluded from the first LDPC matrix to generate the second LDPC matrix.

In one example, when the entirety of the last one or more consecutive sub-matrix columns are punctured from the first LDPC matrix, then the second LDPC matrix (e.g., alternatively referred to as a modified LDPC matrix, an effective LDPC matrix, etc.) includes an upper left-hand portion of the first LDPC matrix. A difference in the number of columns within the first and second LDPC matrices is the same as the number of bits of the at least one parity bit punctured from the other LDPC coded signal to generate the LDPC coded signal. Also, a difference in the number of rows within the first and second LDPC matrices is the same as the number of bits of the at least one parity bit punctured from the other LDPC coded signal to generate the LDPC coded signal.

In another example, such as when cyclic shifting has been performed on one of the sub-matrices in a sub-matrix column that is being punctured from the first LDPC matrix, then the corresponding second LDPC matrix (e.g., modified LDPC matrix, an effective LDPC matrix, etc.) may not necessarily be an upper left-hand portion of the first LDPC matrix given that there may be rows other than exactly the bottom rows of the first LDPC matrix that get eliminated (e.g., because of the cyclic shifting). For example, if the bottom right sub-matrix has the final few columns punctured, then the corresponding rows that need to be eliminated may not necessarily be the rows at the bottom of the first LDPC matrix, but they may be anywhere in the final sub-matrix TOW.

Note also that the processor 130 may operate to receive different LDPC coded signals at different times. For example, a first other LDPC coded signal may be generated from a second other LDPC coded signal based on a first puncturing (e.g., puncturing based on a first puncturing pattern that punctures one or more parity bits from the second other LDPC coded signal). The processor 130 operates to generate a corresponding modified or effective LDPC matrix from the LDPC matrix that corresponds to the second other LDPC coded signal based on the first puncturing. When another LDPC coded signal is received. For example, the processor 130 employees the second LDPC matrix to decode the LDPC coded signal received initially and employs a third LDPC matrix to decode the first other LDPC coded signal (e.g., another or different LDPC coded signal than the LDPC coded signal). Note that any number of different LDPC matrices may be generated based on a singular, common and LDPC matrix based on different puncturings. For example, the processor 130 generates a first set of LDPC matrices based on a first LDPC matrix based on a first set of puncturings. Then, the processor 130 generates a second set of LDPC matrices based on a second LDPC matrix based on a second set of puncturings. Any number of different modified or effective LDPC matrices may be generated to decode signals that are generated based on different puncturings.

Note that device 110 may be implemented to operate as any one or more of a satellite communication device, a wireless communication device, a wired communication device, a fiber-optic communication device, or a mobile communication device and within any one or more communication systems including a satellite communication system, a wireless communication system, a wired communication system, a fiber-optic communication system, or a mobile communication system.

FIG. 1C is a diagram illustrating an example 103 of operation of a communication device within one or more communication systems. Device 110 supports communications to and from one or more other devices, such as device 112. In an example of operation, device 110 receives a first LDPC coded signal that is generated based on a first puncturing of one or more parity bits of a first other LDPC coded signal. The first other LDPC coded signal is generated based on an LDPC code that is characterized by a first LDPC matrix. A processor of device 110 modifies the first LDPC matrix to generate a second LDPC matrix for use to decode the first LDPC coded signal.

Similarly, in another example of operation, device 110 receives a second LDPC coded signal that is generated based on a second puncturing of one or more parity bits of the first other LDPC coded signal or a different first other LDPC coded signal. The different first other LDPC coded signal is also generated based on the same LDPC code that is characterized by the first LDPC matrix and used to generate the first other LDPC coded signal. The processor of device 110 modifies the first LDPC matrix to generate a third LDPC matrix for use to decode the second LDPC coded signal. In this example, two different LDPC matrices (e.g., second and third) are generated from the same first LDPC matrix for use to decode different LDPC coded signals (e.g., first and second).

In even another example of operation, device 110 receives a third LDPC coded signal that is generated based on a first puncturing of one or more parity bits of a second other LDPC coded signal. The second other LDPC coded signal is generated based on another LDPC code that is characterized by another LDPC matrix (different than the first LDPC matrix) and used to generate the third other LDPC coded signal. The processor of device 110 modifies the other LDPC matrix to generate a fourth LDPC matrix for use to decode the third LDPC coded signal.

Note that different LDPC coded signals may be received at different times such that these different signals are characterized by different LDPC codes having different LDPC matrices and generated based on different puncturings of one or more parity bits. The processor operates to perform the appropriate modification of a corresponding LDPC matrix to generate a modified or effective LDPC matrix suitable to decode the received LDPC coded signal based on the puncturing of one or more parity bits employed.

FIG. 2A illustrates an example 201 of an LDPC (Low Density Parity Check) code bipartite graph. An LDPC bipartite graph is sometimes referred to as a "Tanner" graph. An LDPC bipartite graph is a pictorial representation of an LDPC matrix of a corresponding LDPC code, and it shows the relationship of non-null elements of the LDPC matrix that performs bit or variable edge message updating (based on columns of the LDPC matrix) and check message updating (based on rows of the LDPC matrix). An LDPC code is characterized by a binary parity check matrix (i.e., LDPC matrix) that is sparse, such that nearly all of the elements of the matrix have values of zero ("0"). For example, H= $(h_{i,j})_{M \times N}$ is a parity check matrix of an LDPC code with block length N. The LDPC bipartite graph, or "Tanner" graph, is a pictorial illustration of an LDPC matrix.

LDPC codes are linear block codes and hence the set of all codewords x∈C spans the null space of a parity check matrix, H, as follows:

$$Hx^T = 0, \forall x \in C \qquad (1)$$

For an LDPC code, the matrix, H, is a sparse binary matrix of dimension m×n. Each row of H corresponds to a parity check and a set element $h_{ij}$ indicates that data symbol j used for the parity check i. Each column of H corresponds to a codeword symbol.

For each codeword x, there are n symbols of which m are parity symbols. Hence the code rate of the LDPC code, r, is provided as follows:

$$r = (n-m)/n \qquad (2)$$

The row and column weights are defined as the number of set elements in a given row or column of H, respectively. The set elements of H are chosen to satisfy the performance requirements of the code. The number of 1's in the i-th column of the parity check matrix, H, may be denoted as $d_v(i)$, and the number of 1's in the j-th row of the parity check matrix may be denoted as $d_c(j)$. If $d_v(i)=d_v$ for all i, and $d_c(j)=d_c$ for all j, then the LDPC code is called a $(d_v,d_c)$ regular LDPC code, otherwise the LDPC code is called an irregular LDPC code.

A regular LDPC code can be represented as a bipartite graph by its parity check matrix with left side nodes representing variables of the coded bits (or alternatively as the "variable nodes" (or "bit nodes") 261 in a bit-based decoding of LDPC coded signals), and the right side nodes representing check equations (or alternatively as the "check nodes" 262). The bipartite graph (or Tanner graph) of the LDPC code defined by H may be defined by N variable nodes (e.g., N bit nodes) and M check nodes. Every variable node of the N variable nodes 261 has exactly $d_v(i)$ edges. As an example, edge 267 connects the bit node, $v_i$ 265, to one or more of the check nodes (within the M check nodes). The edge 267 is specifically shown as connecting from the bit node, $v_i$ 265, to the check node, $c_j$ 266. This number of $d_v$ edges (shown as $d_v$ 263) may be referred to as the degree of a variable node i. Analogously, a check node of the M check nodes 262 has $d_c(j)$ edges (shown as $d_c$ 264) connecting this node to one or more of the variable nodes (or bit nodes) 261. This number of edges, $d_c$ 264, may be referred to as the degree of the check node j.

An edge 267 between a variable node $v_i$ (or bit node $b_i$) 265 and check node $c_j$ 266 can be defined by e=(i,j). Alternatively, given an edge e=(i,j), the nodes of the edge may alternatively be denoted as by e=(v(e),c(e)) (or e=(b(e),c(e))). The edges in the graph correspond to the set elements of H where a set element $h_{ji}$ indicates that an edge connects a bit (e.g., variable) node i with parity check node j.

Given a variable node $v_i$ (or bit node $b_i$), one may define the set of edges emitting from the node $v_i$ (or bit node $b_i$) by $E_v(i)=\{e|v(e)=i\}$ (or by $E_b(i)=\{e|b(e)=i\}$); these edges are referred to as bit edges, and the messages corresponding to these bit edges are referred to as bit edge messages.

Given a check node $c_j$, one may define the set of edges emitting from the node $c_j$ by $E_c(j)=\{e|c(e)=j\}$; these edges are referred to as check edges, and the messages corresponding to these check edges are referred to as check edge messages. Continuing on, the derivative result will be $|E_v(i)|=d_v$ (or $|E_b(i)|=d_b$) and $|E_c(j)|=d_c$.

Generally speaking, any such codes (e.g., LDPC codes) that can be represented by a bipartite graph may be characterized as a graph code. It is also noted that an irregular LDPC code may also be described using a bipartite graph. However, the degree of each set of nodes within an irregular LDPC code may be chosen according to some distribution. Therefore, for two different variable nodes, $v_{i_1}$ and $v_{i_2}$, of an irregular LDPC code, $|E_v(i_1)|$ may not be equal to $|E_v(i_2)|$. This relationship may also hold true for more than one (e.g., two) check nodes.

Note that terminology such as that of "bit node" and "bit edge message", or equivalents thereof, may be used in the art of LDPC decoding. With respect to LDPC decoding, note that "bit node" and "bit edge message" are alternatively referred to as "variable node" and "variable edge message", respectively. Note that LDPC decoding operates to make one or more estimates of the bit values (or variable values) encoded within an LDPC coded signal.

Note also that the various examples and embodiments described herein may also be applicable to non-binary LDPC codes. Binary LDPC codes generally may be described as being implemented on a bit-basis. Non-binary LDPC codes generally may be described as being implemented on a symbol-basis (e.g., where a symbol may include more than one bit). Generally, non-binary LDPC codes are based on symbols on a Galois field. For example, many of the computations performed within such LDPC coding processing can be described alternatively in the context of a finite field (e.g., a Galois field). Consider a finite field (Galois field) GF(q), where $q=p^m$ and p is a prime number and integer m>0. Let α be a primitive element of this field. Then, the Galois field may be defined as follows:

$$GF(q)=\{0,\alpha,\ldots,\alpha^{q-1}\}$$

As an example, consider that Q is the Galois field order of symbols of an LDPC code, then each symbol would have $2^Q$ or $2^Q$ bits. As a specific example, consider that 4 is the Galois field order of symbols of an LDPC code, then each symbol would have $2^4$ or $2^4$ (or 16) bits. The principles and operations described in this disclosure may also be employed with and applied to non-binary LDPC codes.

FIG. 2B illustrates an example 202 of decoding of an LDPC coded signal. Within a communication device (e.g., communication device 110), a signal received from a communication channel undergoes appropriate demodulation (e.g., processing within an analog front end including digital sampling, digital to analog conversion, filtering, frequency conversion (up or down), gain adjustment and/or scaling, etc.) to generate a received bit sequence. Then, a metric generator 271 calculates log-likelihood ratios (LLRs) for each bit location within the received bit sequence. These LLRs correspond initially to the bit nodes 261 of the LDPC code and its corresponding LDPC bipartite graph that represents the LDPC matrix used to decode the signal.

In an example of LDPC decoding, during initialization, the LLRs are employed for the bit edge messages (e.g., extrinsic information) of the edges extending from the respective bit/variable nodes. Thereafter, one or more decoding cycles or iterations may be performed based on check node processing and bit node processing (iterative decoding 272). Check node processing or check node updating is performed using the original bit edge messages (e.g., the calculated LLRs) such as by a check node processor 274. A bit/variable node processor 273 then uses these updated check edge messages to perform bit node processing or bit node updating to update the variable node soft information for use in the next decoding iteration. The most recently updated variable bit/node soft information is then used to calculate the variable node edge messages (extrinsic information) for this next decoding iteration. The check node processor 274 performs check message updating (based on rows of the LDPC matrix) to generate updated check edge messages, and the bit/variable node processor 273 performs bit or variable edge message updating (based on columns of the LDPC matrix) as also described with reference to FIG. 2A.

When more than one decoding iteration is performed, these variable node edge messages are then used by the check node processor 274 for subsequent check node processing or check node updating to calculate updated check edge messages. Then, bit/variable node processor 273 uses the most recently updated check edge messages to perform bit node processing or bit node updating to update the variable node soft information once again. After a final decoding iteration, which may be determined based on some parameter (e.g., a predetermined number of decoding iterations or when all syndromes of the LDPC code equal zero, as determined by syndrome calculator 276), the last calculated variable node soft information may undergo hard limiting (e.g., in a slicer or hard limiter 275) to generate one or more estimates of one or more bits encoded within the LDPC coded signal.

Generally speaking, this approach for decoding of LDPC coded signals may be referred to as a message passing approach (or iterative message passing approach). Note that LDPC decoding may be performed in any of a variety of architectures including parallel decoding architectures, layer decoding architectures, etc. Device 110 may be implemented to perform encoding and/or decoding of LDPC coded signal using any desired approach or architecture.

Note that the various functional blocks and components depicted in FIG. 2B may be implemented or performed by the processor 130 (and memory 140) of communication device 110. For example, the processor 130 can be implemented to perform such decoding operations and the memory 140 can be implemented to store and perform memory management for the various bit/variable and check edge messages, variable bit/node soft information, extrinsic information, etc. used in the decoding operations.

In another example of operation, the processor 130 operates to modify a first LDPC matrix to generate a second LDPC matrix for use to decode an LDPC coded signal that is generated based on puncturing of one or more parity bits from another LDPC coded signal.

FIG. 2C illustrates an example 203 of an LDPC matrix that is partitioned into sub-matrices. This diagram shows the relationship between an overall LDPC matrix and the individual sub-matrices therein that can be all-zero-valued sub-matrices and/or CSI (Cyclic Shifted Identity) sub-matrices, and the diagram shows the sub-matrix rows and sub-matrix columns of the LDPC matrix that correspond to the sub-matrix arrangement of the LDPC matrix. Note also that a generator matrix, corresponding to an LDPC matrix, may be employed to encode at least one information bit to generate a plurality of LDPC coded bits and/or an LDPC codeword (e.g., such as using back-substitution described below). A generator matrix, G, of an LDPC code has the following relationship with LDPC matrix, H: $GH^T=0$. An LDPC code may be defined or characterized by its LDPC matrix, H, and/or its generator matrix, G.

A processor of a communication device (e.g., processor 130 of communication device 110) may be configured to encode at least one information bit to generate the plurality of LDPC coded bits and/or an LDPC codeword. The processor then transmits the plurality of LDPC coded bits and/or the LDPC codeword, within an LDPC coded signal via a communication interface (e.g., communication interface 320 of communication device 110). The processor may be configured to generate the LDPC coded signal by appropriate modulation of the plurality of LDPC coded bits and/or the LDPC codeword (e.g., processing within an analog front end including digital to analog conversion, filtering, frequency conversion (up or down), gain adjustment, etc.).

A binary LDPC code may be fully described by its parity check matrix (i.e., its LDPC matrix). At the top of the diagram, the individual elements of an LDPC matrix, H, are shown:

$$H = \begin{bmatrix} h_{0,0} & h_{0,1} & \cdots & h_{0,n-1} \\ h_{1,0} & h_{1,1} & \cdots & h_{1,n-1} \\ \cdots & \cdots & \cdots & \cdots \\ h_{m-1,0} & h_{m-1,1} & \cdots & h_{m-1,n-1} \end{bmatrix}$$

where n is the number of bits in a codeword, m is the number of parity check equations of the LDPC code, and $h_{i,j}$ is either 0 or 1. An n-bit vector c (e.g., $c=(c_1, c_2, \ldots, c_N)$) is a codeword (i.e., of the LDPC code) if and only if $Hc^T=0$.

For such an LDPC code, the parity matrix H is also composed of a number of q-by-q (i.e., q×q) square sub-matrices as shown in the bottom portion of the diagram and also below:

$$H = \begin{bmatrix} S_{0,0} & S_{0,1} & \cdots & S_{0,N-1} \\ S_{1,0} & S_{1,1} & \cdots & S_{1,N-1} \\ \cdots & \cdots & \cdots & \cdots \\ S_{M-1,0} & S_{M-1,1} & \cdots & S_{M-1,N-1} \end{bmatrix}$$

where M=m/q, N=n/q, and each sub-matrix, $S_{I,J}$, thereof is a q-by-q sub-matrix that is either an all-zero-valued sub-matrix (i.e., in which all elements thereof are the value of zero "0", which is depicted by a blank or an empty sub-matrix or a sub-matrix with value of "−1" therein in the associated diagrams) or a CSI (Cyclic Shifted Identity) sub-matrix. A CSI sub-matrix S is characterized by a shift-value, $\lambda(S)$, (e.g., a right shift value) such that the components of S are defined as follows:

$$s_{i,j} = \begin{cases} 1 & \text{if } i + \lambda(S) = j(\text{mod}\,q) \\ 0 & \text{otherwise} \end{cases}$$

for any i and j, with $0 \le i < q$ and $0 \le j < q$. For example, the q-by-q identity matrix is itself a CSI matrix with a shift-value $\lambda(S)=0$ (i.e., a CSI sub-matrix with a cyclic shift of zero "0").

As can be seen, the LDPC matrix (as depicted in the lower portion of the diagram), includes various sub-matrix rows and sub-matrix columns. These sub-matrix rows and columns are based on the sub-matrix construction of the LDPC matrix (e.g., shown as sub-matrix rows 0 through M−1 and sub-matrix columns 0 through N−1). This disclosure presents various new designs of LDPC codes.

Note also the following with respect to such LDPC code matrix constructions. A given LDPC code may be a QC (quasi-cyclic)-LDPC code. The definition of such an (n, k) QC-LDPC code is provided as follows:

1. (n−k)-by-n parity check matrix H
2. H is expanded from a binary base matrix $H_b$ of size v-by-u
3. The base matrix $H_b$ is expanded by replacing each sub-matrix in the base matrix with a size z permutation matrix, and each a blank or "−1" negative with a size z zero matrix. The permutations used are circular right shifts as described above, and the set of permutation sub-matrices contains the size z identity matrix and circular right shifted versions of the identity matrix (i.e., CSI sub-matrices).

Because each permutation matrix is specified by a single circular right shift, the binary base matrix information and permutation replacement information can be combined into a single compact model matrix $H_{bm}$. The model matrix $H_{bm}$ is the same size as the binary base matrix $H_b$, with each binary entry (i j) of the base matrix $H_b$ replaced to create the model matrix $H_{bm}$. Each 0 in $H_b$ is replaced by a blank or "−1" negative to denote a size z all-zero matrix, and each other sub-matrix in $H_b$ is replaced by a circular shift size $p(i,j) \ge 0$ (e.g., an entry of "−1" indicates an all-zero-valued sub-matrix, and any other entry such as 0, 1, 2, etc. indicates an identity sub-matrix (if entry is 0), a CSI sub-matrix based on a shift-value of 1 (if entry is 1), a CSI sub-matrix based on a shift-value of 2 (if entry is 2), etc. and so on for any desired cyclic shift-value). The model matrix $H_{bm}$ can then be directly expanded to the entire LDPC matrix, H.

FIG. 3A is a diagram illustrating an example 301 of an LDPC matrix partitioned into a left hand side matrix and a right hand side matrix. The parity matrix H of the bottom of FIG. 2C may be partitioned into a left hand side matrix, $H_{LHS}$, and a right hand side matrix, $H_{RHS}$. The partitioning will be in between two sub-matrix columns. This diagram shows the partitioning being between sub-matrix column x−1 and sub-matrix column x. Left hand side matrix, $H_{LHS}$, and right hand side matrix, $H_{RHS}$, include the same number of sub-matrix rows. In one implementation, the right hand side matrix, $H_{RHS}$, is a square matrix that includes a same number of sub-matrix rows and sub-matrix columns (e.g., the right hand side matrix, $H_{RHS}$, may generally be of any size such as z-by-z, where z is any desired number such as 2, 3, 4, 5, 6, 7, or even higher numbers etc.).

FIG. 3B is a diagram illustrating examples 302 of right hand side matrices of LDPC matrices. A right hand side matrix, $H_{RHS}$, having this form is lower triangular and includes all-zero-valued sub-matrices except for CSI (Cyclic Shifted Identity) sub-matrices located on a main diagonal of the right hand side matrix and certain one or more sub-matrices located below and to the left of the main diagonal of the right hand side matrix. The right hand side matrix is lower triangular and includes first all-zero-valued sub-matrices located above and to the right of the main diagonal of the right hand side matrix. First CSI (Cyclic Shifted Identity) sub-matrices are located on the main diagonal of the right hand side matrix, and second CSI sub-matrices and/or second all-zero-valued sub-matrices are located below and to the left of the main diagonal of the right hand side matrix. Those sub-matrices located below and to the left of the main diagonal of the right hand side matrix are depicted in the diagram as "C/−1" since each of them may be either a CSI sub-matrix or an all-zero-valued sub-matrix.

Note also that such CSI sub-matrices may be based on different CSI values. A CSI value of zero indicates an identity sub-matrix. A CSI value of 1 indicates an identity sub-matrix that has undergone a cyclic shift by 1. Any desired CSI value may be employed up to the sub-matrix size, z, if considering sub-matrices of size z-by-z. Generally speaking, a CSI value of x indicates an identity sub-matrix that has undergone a cyclic shift by x.

While examples have been provided showing LDPC decoding, processor 130 can also be configured to perform encoding of bit(s) to generate LDPC coded bit(s) and/or LDPC codeword(s). Such encoding may be performed using back-substitution. An LDPC matrix may be partitioned into a left hand side matrix, $H_{LHS}$, and a right hand side matrix, $H_{RHS}$, such as shown in FIG. 3A. The right hand side matrix, $H_{RHS}$, can have the form of any of the right hand side matrices of FIG. 3B, and may be of any desired size such as 3-by-3, 4-by-4, 5-by-5, or generally of any size such as z-by-z, where z is any desired number such as 2, 3, 4, 5, 6, 7, etc.

Considering a right hand side matrix, $H_{RHS}$, having the form of those in FIG. 3B, a CSI sub-matrix may be a respective identity matrix that has either not been cyclic shifted (and remains an identity matrix) or a respective identity matrix that has been cyclic shifted by some amount as described above. For sub-matrices of size, L-by-L, input (information) bits, $c_{in}$ (k bits=L(n−m) bits), may be represented as follows: $c_{in}=(c_0, c_1, \ldots, c_{k-1})$ The processor 130 then encodes the input (information) bits and computes L·m parity bits, $c_{par}$ (e.g., LDPC coded bits) as follows: $c_{par}=(c_k, c_{k+1}, \ldots, c_{Ln-1})$ The processor 130 then outputs the following:

$$c_P^T = \begin{pmatrix} C_0 \\ C_1 \\ C_2 \\ C_3 \\ C_4 \end{pmatrix},$$

where $C_i = (c_{L(n-m+i)}, c_{L(n-m+i)+1}, \ldots, c_{L(n-m+i)+L-1})^T.$

For a right hand side matrix, $H_{RHS}$, in the form of those in FIG. 3B being of size 5-by-5 (e.g., where i varies from 0 to 4 in order of 0, 1, 2, 3, 4).

The encoding procedure may be described as follows:
Input: $c_1=(c_0, c_1, \ldots, c_{k-1})$
Step 1: compute $V_i=H_{L_i}c_I^T$, such that i=0, . . . , 4.

Step 2: back-substitution $C_0=V_0(L-u_{0,0})$ $C_1=V_1(L-u_{1,1})+C_0((L-u_{1,1}+u_{1,0}) \bmod L)$ $C_2=V_2(L-u_{2,2})+C_1((L-u_{2,2}+u_{2,1}) \bmod L)$ $C_3=V_3(L-u_{3,3})+C_2((L-u_{3,3}+u_{3,2}) \bmod L)$ $C_4=V_4(L-u_{4,4})+C_3((L-u_{4,4}+u_{4,3}) \bmod L)$ Output:

$$c_P^T = \begin{pmatrix} C_0 \\ C_1 \\ C_2 \\ C_3 \\ C_4 \end{pmatrix}.$$

Note that this approach shows just one possible example by which encoding based on an LDPC code may be performed. Generally, the decoding operations described herein may be performed on an LDPC coded signal that is generated using any LDPC encoding approach.

FIG. 4A is a diagram illustrating an example 401 of a communication device configured to perform LDPC encoding and puncturing. A forward error correction (FEC) encoder 420 processes information bits to generate coded bits. In the context of LDPC encoding, encoder 420 employs a generator matrix that is based on a given LDPC code that may also be characterized by a corresponding LDPC matrix. The LDPC matrix can have the characteristics and forms such as described with reference to FIG. 2C, FIG. 3A, FIG. 3B, etc. such that all sub-matrices of the LDPC matrix are all-zero-valued sub-matrices and/or CSI sub-matrices. For example, the LDPC matrix may be viewed as being composed of a left hand side matrix and a right hand side matrix that is lower triangular and includes all-zero-valued sub-matrices except for CSI (Cyclic Shifted Identity) sub-matrices located on a main diagonal of the right hand side matrix and certain one or more sub-matrices located below and to the left of the main diagonal of the right hand side matrix. First CSI (Cyclic Shifted Identity) sub-matrices are located on the main diagonal of the right hand side matrix, and second CSI sub-matrices and/or second all-zero-valued sub-matrices are located below and to the left of the main diagonal of the right hand side matrix.

A puncturer 430 punctures one or more subsets of information bits and one or more subsets of parity bits from the coded bits generated by the FEC encoder 420 to generate one or more codewords. These subsets of information bits and parity bits may be groups of contiguous bits within the coded bits. For example, a first contiguous subset of information bits (e.g., having a first period) may be punctured, and a contiguous subset of parity bits may be punctured (e.g., having the first or a second period). In other examples, more than one contiguous subset may be punctured from the coded bits (e.g., two or more contiguous subsets of information bits may be punctured, and two or more contiguous subsets of parity bits may be punctured). In even other examples, different numbers of subsets of bits may be punctured from the information bits and the parity bits (e.g., one subset of bits punctured from information bits, and to subsets of bits punctured from the parity bits). Such puncturing may be performed using different periods of bits, and/or different starting locations within the coded bits.

A transmit (TX) driver 490 processes the one or more codewords to generate one or more continuous-time signals for transmission to one or more other devices via one or more communication channels. The TX driver 490 may perform operations such as those of an analog front end (AFE) of a communication device (e.g., digital to analog conversion, frequency conversion such as conversion, scaling, filtering, etc.). Generally, the TX driver 490 operates to generate a signal suitable for transmission from the communication device.

FIG. 4B is a diagram illustrating an example 402 of a communication device configured to perform bit filling, LDPC encoding, shortening, and puncturing. The example 402 has some similarity to the example 401 of FIG. 4A with differences being that a bit filler 405 operates to add one or more zero-valued bits to the incoming information bits before encoding by the FEC encoder 420. After FEC encoding, a shortener 425 operates to remove those zero-valued bits that were added to the information bit before undergoing FEC encoding. The other components (420, 430, and 490) in the example 402 generally operate similarly as within example 401 of FIG. 4A.

Note that the operations of the various functional blocks, components, etc. within FIG. 4A and FIG. 4B may be performed within communication device 110. For example, communication interface 320 of device 110 may be configured to perform the operations of the transmit (TX) driver 490. The processor 130 of device 110 may be configured to perform bit filling, LDPC encoding, shortening, puncturing, and/or other related operations.

Note that alternative approaches that generate an LDPC coded signal based on puncturing of one or more bits from another LDPC coded signal may be used. Regardless of the particular manner by which an LDPC coded signal is generated, a device that operates using the various principles described herein can effectively be code that LDPC coded signal based on a modified or effective LDPC matrix generated from another LDPC matrix that corresponds to the other LDPC coded signal.

FIG. 4C is a diagram illustrating an example 403 of puncturing of parity bits from an LDPC codeword. In an example of operation, a device's processor encodes one or more information bits to generate one or more coded bits. Such encoding may be performed based on a LDPC code, such as using a generator matrix of that LDPC code. The coded bits may be viewed as being a code word, such as an LDPC codeword. With respect to a systematic code, the LDPC codeword includes the information bits that underwent LDPC encoding and parity or redundancy bits. A device's processor punctures one or more of the parity bits. In the example of this diagram, the LDPC codeword is shown as b1 through b2, b3, b4, b5. Each of these blocks may include concealers one bit or multiple bits. For example, in a sub-matrix based implementation, each of the blocks may correspond to a sub-matrix column, and the number of bits within that block corresponds to the size of sub matrix (e.g., if the sub-matrix size is n×n, then the block includes n bits, where n is an integer greater than or equal to one). In this illustration, the bits on the right hand side of the LDPC codeword include parity bits (e.g., block b5 and optionally block b4, etc.). In one example, the device's processor punctures bits from the block b5. Again, the block b5 may include as few as one bit or up to n bits in a sub-matrix based implementation. After puncturing block b5, the resulting LDPC codeword includes b1 through b2, b3, b4.

Note that different puncturing patterns may puncture different numbers of parity bits in different locations. For example, a first puncturing may puncture a single parity bit from the LDPC codeword (e.g., located the end, beginning, or somewhere in the middle of the parity bits of the LDPC codeword). A second puncturing may puncture a first parity bit from a first location of the LDPC codeword and a second parity bit from a second location of the LDPC codeword. The first and second parity bits may be adjacent to one another or separated by one or more other bits in the LDPC codeword. A third puncturing may puncture a single set of contiguous parity bits from the LDPC codeword (e.g., located the end, beginning, or somewhere in the middle of the parity bits of the LDPC codeword). A fourth puncturing may puncture two or more sets of parity bits from the LDPC codeword. Fifth puncturing may puncture one or more single parity bits from one or more corresponding locations and one or more sets of parity bits from one or more other corresponding locations of the LDPC codeword. Generally speaking, any number of different puncturings may be performed of different bits from the LDPC codeword. Regardless of the manner in which parity bits are punctured from the LDPC codeword, a device operating using the principles described herein can perform decoding of such a resulting signal using a modified or effective LDPC matrix that is generated based on the puncturing.

FIG. 4D is a diagram illustrating an example 404 of processing an LDPC matrix to generate an effective LDPC matrix based on puncturing. On the left hand side of the diagram, an LDPC matrix is shown. Each respective block may represent an individual element of the LDPC matrix in one implementation or a sub-matrix of the LDPC matrix in another implementation. Assuming puncturing of an LDPC codeword is performed as shown in FIG. 4C, a device's processor modifies the LDPC matrix on a left hand side to generate the LDPC matrix on the right hand side by excluding a column corresponding to the one or more parity bits that have been punctured from the LDPC codeword above. In such an example in which the parity bits of block b5 are punctured, then the columns corresponding to those parity bits are excluded as well as the bottom row of the LDPC matrix on the left hand side to generate the modified or effective LDPC matrix on the right hand side. This modified or effective LDPC matrix on the right hand side may be used to decode a signal that includes the LDPC codeword shown on the right hand side of FIG. 4C. Note that different modifications of the LDPC matrix on the left hand side may be performed based on different puncturings that may be performed to the LDPC codeword on the left hand side of FIG. 4C.

Figure 5:
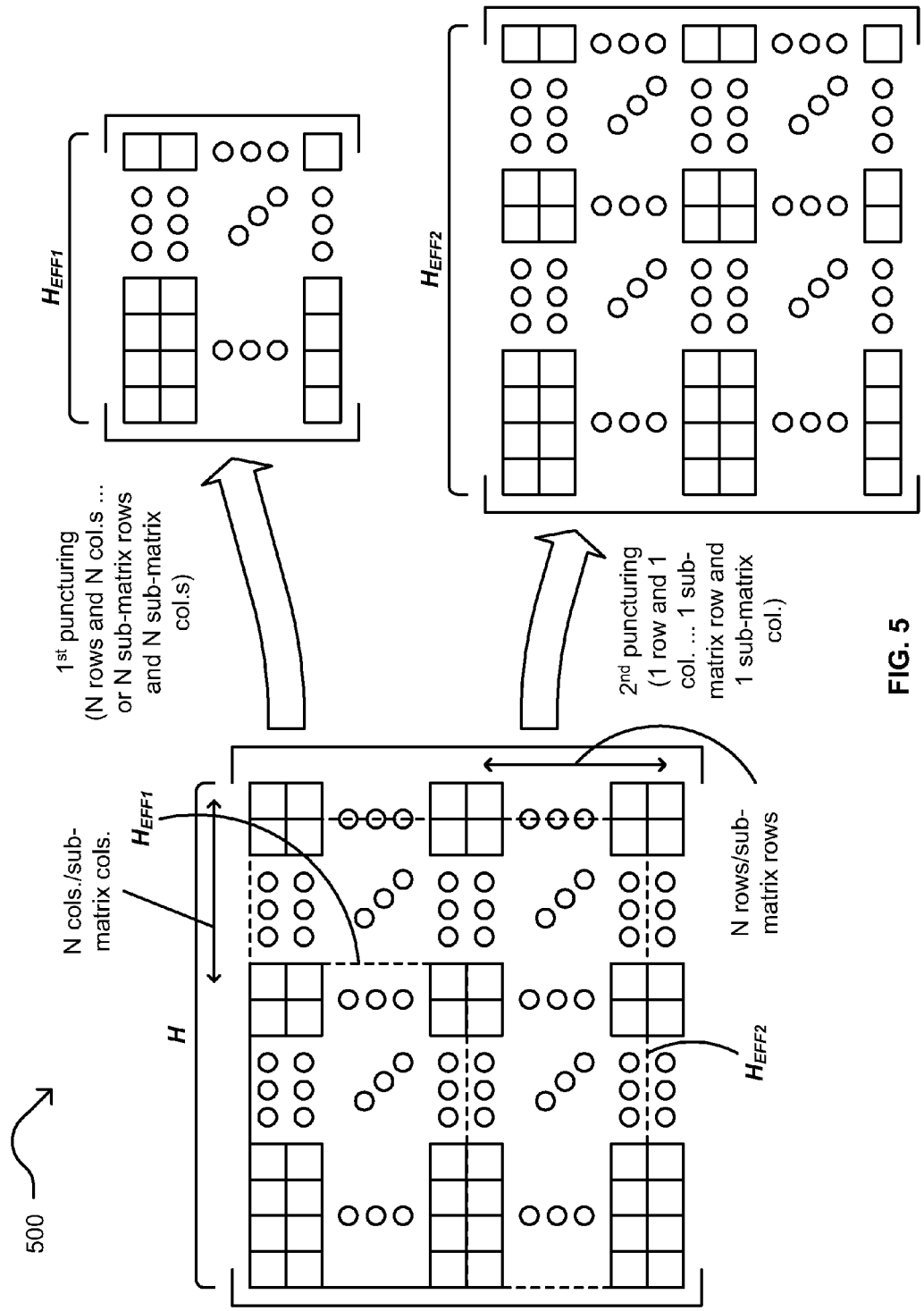
FIG. 5 is a diagram illustrating another example of processing an LDPC matrix to generate different effective LDPC matrices based on different puncturing.

FIG. 5 is a diagram illustrating another example 500 of processing an LDPC matrix to generate different effective LDPC matrices based on different puncturing. This diagram shows a first LDPC matrix on the left hand side of the diagram where each block may represent an individual element of the LDPC matrix in one implementation or a sub-matrix of the LDPC matrix in another implementation. Generally, the columns located on the right hand side of this first LDPC matrix will correspond to parity bits within an LDPC codeword. Different puncturings may be performed to the parity bits of LDPC codewords generated based on such an LDPC code.

Within a first puncturing, N (where N is an integer greater than or equal to 1) columns of the right hand portion of the first LDPC matrix and N rows of the bottom portion of the first LDPC matrix are excluded to generate the second LDPC matrix in the upper right location of FIG. 5. In such an example, N contiguous parity bits are punctured from an LDPC codeword based on this LDPC code. As such, columns corresponding to those puncture locations are excluded from the first LDPC matrix. Also, a number of rows, which is the same as the number of columns excluded, is also excluded from the bottom portion of the first LDPC matrix. Rows from the LDPC matrix that correspond to the syndrome calculations that operate based on the bits that have been punctured are also excluded.

In such an example, note that an intersection of the columns excluded and the rows excluded from the first LDPC matrix intersect in a square portion that is located at the lower right-hand portion of the first LDPC matrix. The second LDPC matrix (e.g., a modified or effective LDPC matrix) that is generated by excluding these columns and rows from the first LDPC matrix such that the second LDPC matrix corresponds to an upper left hand portion of the first LDPC matrix. However, there may be other instances (e.g., because of cyclic shifting of a sub-matrix within a sub-matrix column being punctured) in which rows other than the bottom-most rows are eliminated from the first LDPC matrix.

Within a second puncturing, a singular column of blocks located on the right-hand side of the first LDPC matrix and a singular row of blocks located along the bottom of the first LDPC matrix are excluded to generate the second LDPC matrix. In such an example, puncturing is performed only of the bits that correspond to the right hand most column of the first LDPC matrix.

Within other puncturings, note that different groups of parity bits may be punctured (e.g., including bits that may be contiguous, non-contiguous, etc.). Then, based on whatever puncturings is performed to the parity bits generated using the LDPC code associated with the first LDPC matrix, those column locations will be excluded from the first LDPC matrix. Then, the corresponding rows will also be excluded from the LDPC matrix. Considering the 3 right hand-most columns of the first LDPC matrix being numbered 1, 2, 3 (where 3 is the right hand most column) and the 3 bottom-most columns of the first LDPC matrix are numbered a, b, c (where c is the bottom-most column), then if parity bits associated with the columns 1 and 3 are punctured, then the columns 1 and 3 and the rows a and c will be excluded from the first LDPC matrix.

Generally speaking, when columns are excluded from the first parity check matrix based on the puncturing that is performed, the parity checks associated with those columns are also excluded. As such, a same number of columns and rows are excluded from the first LDPC matrix to generate the second LDPC matrix. The one or more columns excluded correspond to those bits that have been punctured from the LDPC codeword, and the one or more rows excluded correspond to those parity checks that will be excluded from the LDPC decoding process.

Within a device that may be configurable to perform decoding of different LDPC coded signals based on different puncturings, the device can disable those rows from the LDPC matrix that correspond to the syndrome calculations that are based on the bits that have been punctured. As such, any feedback of those excluded rows (excluded parity rows) to the variable nodes would also be disabled.

FIG. 6A is a diagram illustrating an embodiment of a method 601 for execution by one or more communication devices. The method 601 begins by receiving (e.g., via a communication interface of the communication device) a low density parity check (LDPC) coded signal (block 610). The LDPC coded signal is generated from another LDPC coded signal that has had at least one parity bit punctured there from, and the other LDPC coded signal is generated based on an LDPC code that is characterized by a first LDPC matrix.

The method 601 continues by processing the first LDPC matrix to generate a second LDPC matrix by excluding at least one column and at least one row from the first LDPC matrix based on a number of bits of the at least one parity bit punctured from the other LDPC coded signal to generate the LDPC coded signal (block 620). The method 601 then operates by decoding the LDPC coded signal using the second LDPC matrix to make a plurality of estimates of a plurality of information bits encoded within the LDPC coded signal (block 630).

In some examples, the first LDPC matrix includes sub-matrices arranged in a left hand side matrix and a right hand side matrix. The right hand side matrix is lower triangular and includes first all-zero-valued sub-matrices located above and to the right of a main diagonal of the right hand side matrix, and first CSI (Cyclic Shifted Identity) sub-matrices that are located on the main diagonal of the right hand side matrix. Second CSI sub-matrices and second all-zero-valued sub-matrices are located below and to the left of the main diagonal of the right hand side matrix.

In some other examples, the second LDPC matrix includes an upper left-hand portion of the first LDPC matrix (e.g., the second LDPC matrix is composed of the upper left-hand portion of the first LDPC matrix). A first difference between a first number of columns of the first LDPC matrix and a second number of columns of the second LDPC matrix is the same as the number of bits of the at least one parity bit punctured from the other LDPC coded signal to generate the LDPC coded signal. The elimination or exclusion of the rows and columns from the first LDPC matrix is the same as the number of parity bits punctured from the other LDPC coded signal to generate the LDPC coded signal. A second difference between a first number of rows of the first LDPC matrix and a second number of rows of the second LDPC matrix is the same as the number of bits of the at least one parity bit punctured from the other LDPC coded signal to generate the LDPC coded signal.

FIG. 6B is a diagram illustrating another embodiment of a method 602 for execution by one or more communication devices. The method 602 begins by receiving a first LDPC coded signal (block 611). This first LDPC coded signal is based on first puncturing of signal that is generated based on an LDPC code. The method 602 continues by processing a first LDPC matrix to generate a second LDPC matrix by excluding one or more rows and one or more columns based on the first puncturing (block 621). The method 602 then operates by decoding the first LDPC coded signal using the second LDPC matrix to generate estimates of information bits encoded therein (block 631).

The method 602 continues by receiving a second LDPC coded signal (block 641). This second LDPC coded signal is based on second puncturing of the signal or another signal that is generated based on the LDPC code (e.g., the same LDPC code used to generate the signal used to generate the first LDPC coded signal). The method 602 then operates by processing the first LDPC matrix to generate a third LDPC matrix by excluding other one or more rows and other one or more columns based on the second puncturing (block 651). The method 602 continues by decoding the second LDPC coded signal using the third LDPC matrix to generate estimates of information bits encoded therein (block 661).

In other examples, different LDPC coded signals (e.g., first and second) may be generated based on different LDPC codes (e.g., first LDPC coded signal is based on first puncturing of a first signal that is generated based on a first LDPC code, and second LDPC coded signal is based on puncturing of a second signal that is generated based on a second LDPC code). Any number of puncturings and/or LDPC codes may be used to generate different LDPC coded signals for use in communications as described herein.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to," "operably coupled to," "coupled to," and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to," "operable to," "coupled to," or "operably coupled to" indicates that an item includes one or more of power connections, input(s), output(s), etc., to perform, when activated, one or more its corresponding functions and may further include inferred coupling to one or more other items. As may still further be used herein, the term "associated with," includes direct and/or indirect coupling of separate items and/or one item being embedded within another item.

As may be used herein, the term "compares favorably" or equivalent, indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

As may also be used herein, the terms "processing module," "processing circuit," "processor," and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments of an invention have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

The one or more embodiments are used herein to illustrate one or more aspects, one or more features, one or more concepts, and/or one or more examples of the invention. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module includes a processing module, a processor, a functional block, hardware, and/or memory that stores operational instructions for performing one or more functions as may be described herein. Note that, if the module is implemented via hardware, the hardware may operate independently and/or in conjunction with software and/or firmware. As also used herein, a module may contain one or more sub-modules, each of which may be one or more modules.

While particular combinations of various functions and features of the one or more embodiments have been expressly described herein, other combinations of these features and functions are likewise possible. The present disclosure of an invention is not limited by the particular examples disclosed herein and expressly incorporates these other combinations.

What is claimed is:

1. A communication device comprising:
   a communication interface; and
   a processor, the processor and communication interface configured to:
      receive a low density parity check (LDPC) coded signal, wherein the LDPC coded signal is generated from an other LDPC coded signal that has had at least one parity bit punctured there from, wherein the other LDPC coded signal is generated based on an LDPC code that is characterized by a first LDPC matrix;
      process the first LDPC matrix to generate a second LDPC matrix by excluding at least one column and at least one row from the first LDPC matrix based on a number of bits of the at least one parity bit punctured from the other LDPC coded signal to generate the LDPC coded signal; and
      decode the LDPC coded signal using the second LDPC matrix to make a plurality of estimates of a plurality of information bits encoded within the LDPC coded signal.

2. The communication device of claim 1, wherein the first LDPC matrix includes a plurality of sub-matrices arranged in a left hand side matrix and a right hand side matrix, wherein the right hand side matrix is lower triangular and includes a first plurality of all-zero-valued sub-matrices located above and to the right of a main diagonal of the right hand side matrix, wherein a first plurality of CSI (Cyclic Shifted Identity) sub-matrices are located on the main diagonal of the right hand side matrix, and wherein a second plurality of CSI sub-matrices and a second plurality of all-zero-valued sub-matrices are located below and left of the main diagonal of the right hand side matrix.

3. The communication device of claim 1, wherein the processor and communication interface are further configured to:
   process the first LDPC matrix to generate the second LDPC matrix by excluding a plurality of columns and a plurality of rows from the first LDPC matrix based on the number of bits of the at least one parity bit punctured from the other LDPC coded signal to generate the LDPC coded signal, wherein a number of columns within the plurality of columns is same as a number of rows within the plurality of rows.

4. The communication device of claim 1, wherein:
   the second LDPC matrix includes an upper left-hand portion of the first LDPC matrix;
   a first difference between a first number of columns of the first LDPC matrix and a second number of columns of the second LDPC matrix is same as the number of bits of the at least one parity bit punctured from the other LDPC coded signal to generate the LDPC coded signal; and
   a second difference between a first number of rows of the first LDPC matrix and a second number of rows of the second LDPC matrix is same as the number of bits of the at least one parity bit punctured from the other LDPC coded signal to generate the LDPC coded signal.

5. The communication device of claim 1, wherein the processor and communication interface are further configured to:
   receive a first other LDPC coded signal, wherein the first other LDPC coded signal is generated from a second other LDPC coded signal that has had an other at least one parity bit punctured there from, wherein the second other LDPC coded signal is generated based on the LDPC code that is characterized by the first LDPC matrix;
   process the first LDPC matrix to generate a third LDPC matrix by excluding an other at least one column and an other at least one row from the first LDPC matrix based on an other number of bits of the other at least one parity bit punctured from the second other LDPC coded signal to generate the first other LDPC coded signal; and
   decode the first other LDPC coded signal using the third LDPC matrix to make an other plurality of estimates of an other plurality of information bits encoded within the first other LDPC coded signal.

6. The communication device of claim 1, wherein the processor and communication interface are further configured to:
   receive a first other LDPC coded signal, wherein the first other LDPC coded signal is generated from a second other LDPC coded signal that has had an other at least one parity bit punctured there from, wherein the second other LDPC coded signal is generated based on the LDPC code that is characterized by a third LDPC matrix;
   process the third LDPC matrix to generate a fourth LDPC matrix by excluding at least one column and at least one row from the third LDPC matrix based on an other number of bits of the other at least one parity bit punctured from the second other LDPC coded signal to generate the first other LDPC coded signal; and
   decode the first other LDPC coded signal using the fourth LDPC matrix to make an other plurality of estimates of an other plurality of information bits encoded within the first other LDPC coded signal.

7. The communication device of claim 1, wherein the LDPC code is a non-binary LDPC code.

8. The communication device of claim 1 further comprising:
   the processor and the communication interface configured to support communications within at least one of a satellite communication system, a wireless communication system, a wired communication system, a fiber-optic communication system, or a mobile communication system.

9. A communication device comprising:
a communication interface; and
a processor, the processor and communication interface configured to:
  receive a low density parity check (LDPC) coded signal, wherein the LDPC coded signal is generated from an other LDPC coded signal that has had at least one parity bit punctured there from, wherein the other LDPC coded signal is generated based on an LDPC code that is characterized by a first LDPC matrix, wherein:
    the first LDPC matrix includes a plurality of sub-matrices arranged in a left hand side matrix and a right hand side matrix;
    the right hand side matrix is lower triangular and includes a first plurality of all-zero-valued sub-matrices located above and to the right of a main diagonal of the right hand side matrix;
    a first plurality of CSI (Cyclic Shifted Identity) sub-matrices are located on the main diagonal of the right hand side matrix; and
    a second plurality of CSI sub-matrices and a second plurality of all-zero-valued sub-matrices are located below and left of the main diagonal of the right hand side matrix;
  process the first LDPC matrix to generate a second LDPC matrix by excluding at least one column and at least one row from the first LDPC matrix based on a number of bits of the at least one parity bit punctured from the other LDPC coded signal to generate the LDPC coded signal, wherein the second LDPC matrix includes an upper left-hand portion of the first LDPC matrix; and
  decode the LDPC coded signal using the second LDPC matrix to make a plurality of estimates of a plurality of information bits encoded within the LDPC coded signal.

10. The communication device of claim 9, wherein the processor and communication interface are further configured to:
  process the first LDPC matrix to generate the second LDPC matrix by excluding a plurality of columns and a plurality of rows from the first LDPC matrix based on the number of bits of the at least one parity bit punctured from the other LDPC coded signal to generate the LDPC coded signal, wherein a number of columns within the plurality of columns is same as a number of rows within the plurality of rows.

11. The communication device of claim 9, wherein:
  a first difference between a first number of columns of the first LDPC matrix and a second number of columns of the second LDPC matrix is same as the number of bits of the at least one parity bit punctured from the other LDPC coded signal to generate the LDPC coded signal; and
  a second difference between a first number of rows of the first LDPC matrix and a second number of rows of the second LDPC matrix is same as the number of bits of the at least one parity bit punctured from the other LDPC coded signal to generate the LDPC coded signal.

12. The communication device of claim 9, wherein the processor and communication interface are further configured to:
  receive a first other LDPC coded signal, wherein the first other LDPC coded signal is generated from a second other LDPC coded signal that has had an other at least one parity bit punctured there from, wherein the second other LDPC coded signal is generated based on the LDPC code that is characterized by the first LDPC matrix;
  process the first LDPC matrix to generate a third LDPC matrix by excluding an other at least one column and an other at least one row from the first LDPC matrix based on an other number of bits of the other at least one parity bit punctured from the second other LDPC coded signal to generate the first other LDPC coded signal; and
  decode the first LDPC coded signal using the third LDPC matrix to make an other plurality of estimates of an other plurality of information bits encoded within the first other LDPC coded signal.

13. The communication device of claim 9 further comprising:
  the processor and the communication interface configured to support communications within at least one of a satellite communication system, a wireless communication system, a wired communication system, a fiber-optic communication system, or a mobile communication system.

14. A method for execution by a communication device, the method comprising:
  receiving, via a communication interface of the communication device, a low density parity check (LDPC) coded signal, wherein the LDPC coded signal is generated from an other LDPC coded signal that has had at least one parity bit punctured there from, wherein the other LDPC coded signal is generated based on an LDPC code that is characterized by a first LDPC matrix;
  processing the first LDPC matrix to generate a second LDPC matrix by excluding at least one column and at least one row from the first LDPC matrix based on a number of bits of the at least one parity bit punctured from the other LDPC coded signal to generate the LDPC coded signal; and
  decoding the LDPC coded signal using the second LDPC matrix to make a plurality of estimates of a plurality of information bits encoded within the LDPC coded signal.

15. The method of claim 14, wherein the first LDPC matrix includes a plurality of sub-matrices arranged in a left hand side matrix and a right hand side matrix, wherein the right hand side matrix is lower triangular and includes a first plurality of all-zero-valued sub-matrices located above and to the right of a main diagonal of the right hand side matrix, wherein a first plurality of CSI (Cyclic Shifted Identity) sub-matrices are located on the main diagonal of the right hand side matrix, and wherein a second plurality of CSI sub-matrices and a second plurality of all-zero-valued sub-matrices are located below and left of the main diagonal of the right hand side matrix.

16. The method of claim 14 further comprising:
  processing the first LDPC matrix to generate the second LDPC matrix by excluding a plurality of columns and a plurality of rows from the first LDPC matrix based on the number of bits of the at least one parity bit punctured from the other LDPC coded signal to generate the LDPC coded signal, wherein a number of columns within the plurality of columns is same as a number of rows within the plurality of rows.

17. The method of claim 14, wherein:
  the second LDPC matrix includes an upper left-hand portion of the first LDPC matrix;

a first difference between a first number of columns of the first LDPC matrix and a second number of columns of the second LDPC matrix is same as the number of bits of the at least one parity bit punctured from the other LDPC coded signal to generate the LDPC coded signal; and a second difference between a first number of rows of the first LDPC matrix and a second number of rows of the second LDPC matrix is same as the number of bits of the at least one parity bit punctured from the other LDPC coded signal to generate the LDPC coded signal.

18. The method of claim 14 further comprising:

receiving a first other LDPC coded signal, wherein the first other LDPC coded signal is generated from a second other LDPC coded signal that has had an other at least one parity bit punctured there from, wherein the second other LDPC coded signal is generated based on the LDPC code that is characterized by the first LDPC matrix;

processing the first LDPC matrix to generate a third LDPC matrix by excluding an other at least one column and an other at least one row from the first LDPC matrix based on an other number of bits of the other at least one parity bit punctured from the second other LDPC coded signal to generate the first other LDPC coded signal; and decoding the first LDPC coded signal using the third LDPC matrix to make an other plurality of estimates of an other plurality of information bits encoded within the first other LDPC coded signal.

19. The method of claim 14 further comprising:

receiving a first other LDPC coded signal, wherein the first other LDPC coded signal is generated from a second other LDPC coded signal that has had an other at least one parity bit punctured there from, wherein the second other LDPC coded signal is generated based on the LDPC code that is characterized by a third LDPC matrix;

processing the third LDPC matrix to generate a fourth LDPC matrix by excluding at least one column and at least one row from the third LDPC matrix based on an other number of bits of the other at least one parity bit punctured from the second other LDPC coded signal to generate the first other LDPC coded signal; and decoding the first LDPC coded signal using the fourth LDPC matrix to make an other plurality of estimates of an other plurality of information bits encoded within the first other LDPC coded signal.

20. The method of claim 14 further comprising:

operating the communication interface of the communication device to support communications within at least one of a satellite communication system, a wireless communication system, a wired communication system, a fiber-optic communication system, or a mobile communication system.

* * * * *